United States Patent
Gaulin et al.

(10) Patent No.: US 10,957,618 B2
(45) Date of Patent: Mar. 23, 2021

(54) THERMALLY CONDUCTIVE ELECTRONIC PACKAGING

(71) Applicant: Apex Microtechnology, Inc., Tucson, AZ (US)

(72) Inventors: Kirby Gaulin, Tucson, AZ (US); Emily Sataua, Tucson, AZ (US); Alan Varner, Tucson, AZ (US)

(73) Assignee: Apex Microtechnology, Inc., Tucson, AZ (US)

( * ) Notice: Subject to any disclaimer, the term of this patent is extended or adjusted under 35 U.S.C. 154(b) by 7 days.

(21) Appl. No.: 16/425,063

(22) Filed: May 29, 2019

(65) Prior Publication Data
US 2019/0371696 A1 Dec. 5, 2019

Related U.S. Application Data

(60) Provisional application No. 62/677,519, filed on May 29, 2018.

(51) Int. Cl.
*H01L 23/34* (2006.01)
*H01L 23/367* (2006.01)
(Continued)

(52) U.S. Cl.
CPC ...... *H01L 23/3672* (2013.01); *H01L 23/3736* (2013.01); *H01L 23/49811* (2013.01); *H05K 1/0209* (2013.01)

(58) Field of Classification Search
CPC ............ H01L 23/3672; H01L 23/3735; H01L 23/49811
(Continued)

(56) References Cited

U.S. PATENT DOCUMENTS 6,060,772 A * 5/2000 Sugawara ............. H01L 25/162
257/678
8,575,756 B2 * 11/2013 Jang ....................... H01L 24/73
257/773
(Continued)

OTHER PUBLICATIONS

International Search Report and Written Opinion were dated Aug. 9, 2019 by the International Searching Authority for International Application No. PCT/US2019/034291, filed on May 29, 2019 (Applicant-Apex Microtechnology, Inc.) (11 Pages).

*Primary Examiner* — Luan C Thai
(74) *Attorney, Agent, or Firm* — Ballard Spahr LLP (57) ABSTRACT

Disclosed herein are apparatuses and methods for configuring a circuit board to have a plurality of die having different bottom-side electrical potential. An apparatus comprises a circuit board comprising a metallic base plate, a thermally conductive dielectric, and a plurality of metallic pads. Each of a plurality of die of the apparatus is coupled to a respective one of the plurality of metallic pads, and the plurality of die comprises a first die and a second die. Based on each of the plurality of die being coupled to a respective one of the plurality of metallic foil pads, the first die is configured to exhibit a first bottom-side electrical potential and the second die is configured to exhibit a second bottom-side electrical potential. The apparatus is further configured to conduct heat from the plurality of die away from the plurality of die via at least the metallic base plate, the thermally conductive dielectric, and the plurality of metallic pads.

20 Claims, 6 Drawing Sheets

(51) Int. Cl.
   *H01L 23/498*   (2006.01)
   *H01L 23/373*   (2006.01)
   *H05K 1/02*   (2006.01)

(58) Field of Classification Search
   USPC .......................................................... 257/713
   See application file for complete search history.

(56) References Cited

U.S. PATENT DOCUMENTS

| | | | |
|---|---|---|---|
| 8,981,552 B2* | 3/2015 | Shimoike | H01L 24/92 |
| | | | 257/693 |
| 9,059,334 B2* | 6/2015 | Usui | H01L 24/40 |
| 10,128,165 B2* | 11/2018 | Hable | H01L 23/3121 |
| 10,128,174 B2* | 11/2018 | Padmanabhan | H01L 25/072 |
| 10,211,133 B2* | 2/2019 | Grassmann | H01L 27/73 |
| 10,672,677 B2* | 6/2020 | Chang | H01L 24/84 |
| 2002/0171144 A1 | 11/2002 | Zhang et al. | |
| 2004/0166709 A1 | 8/2004 | West | |
| 2008/0116569 A1 | 5/2008 | Huang et al. | |
| 2008/0252372 A1 | 10/2008 | Williams | |

* cited by examiner

THERMALLY CONDUCTIVE ELECTRONIC PACKAGING

CROSS REFERENCE TO RELATED PATENT APPLICATION

This application claims priority to U.S. Provisional Application No. 62/677,519 filed May 29, 2018, which is herein incorporated by reference in its entirety.

BACKGROUND

Packaging for electronics can serve several purposes. For example, packaging can prevent physical damage and corrosion, provide electrical isolation, and enable thermal dissipation for the electronics contained within the packaging. Packaging is increasingly important due to rapid advances in integrated circuit (IC) fabrication and the demands of a growing market in almost all areas of application, such as power electronics, portable electronics, consumer electronics, home electronics, computing electronics, automotive, railway, aerospace and defense, industrial drivers and motor controls, medical devices, and others. However, design and performance requirements for these electronics are demanding, for example within harsh mechanical, thermal, and electrical environments. This can be due to high intrinsic power dissipation of the electronics.

Packages in the electronics industry address the foregoing issues, but they also present challenges for incorporating multiple die with one or more different backside electrical potentials. For example, these packages may use a slug-up, surface mount technology (SMT) package that has less than desirable performance characteristics for the thermal path from the die to a heat sink. These packages may also require an external heat pad to be attached to a pad on the bottom of a printed circuit board (PCB) and may use standard lead frame material as the thermal pad, thereby potentially limiting the thermal performance to that of a large copper area on the PCB. Such configurations have several shortcomings. These shortcomings may include, but are not limited to, the failure to minimize thermal paths for dissipating heat from the internal die, lack of electrical isolation between the internal die and any external heat tab that connects to the heat sink, preventing the heat sink from being kept at a non-zero electrical potential, and preventing full power dissipation of the package. These and other shortcomings are addressed by the methods and systems described herein.

SUMMARY

It is to be understood that both the following general description and the following detailed description are exemplary and explanatory only and are not restrictive. Provided are methods and systems for thermally conductive electronic packaging.

An apparatus comprises a circuit board with a metallic base plate, a thermally conductive dielectric, and a plurality of metallic pads. The apparatus further comprises a plurality of die, where each of the plurality of die is coupled to a respective one of the plurality of metallic pads, and the plurality of die comprises a first die and a second die.

Based on each of the plurality of die being coupled to a respective one of the plurality of metallic foil pads, the first die is configured to exhibit a first bottom-side electrical potential, and the second die is configured to exhibit a second bottom-side electrical potential. The apparatus is further configured to conduct heat from the plurality of die away from the plurality of die via at least the metallic base plate, the thermally conductive dielectric, and the plurality of metallic pads.

A method comprises manufacturing a circuit board with a metallic base plate, a thermally conductive dielectric, and a plurality of metallic pads. The method further comprises a step for including a plurality of die, wherein each of the plurality of die is coupled to a respective one of the plurality of metallic pads, and the plurality of die comprises a first die and a second die.

Based on each of the plurality of die being coupled to a respective one of the plurality of metallic foil pads, the first die is configured to exhibit a first bottom-side electrical potential, and the second die is configured to exhibit a second bottom-side electrical potential. The apparatus is further configured to conduct heat from the plurality of die away from the plurality of die via at least the metallic base plate, the thermally conductive dielectric, and the plurality of metallic pads.

Additional advantages will be set forth in part in the description which follows or may be learned by practice. The advantages will be realized and attained by means of the elements and combinations particularly pointed out in the appended claims.

BRIEF DESCRIPTION OF THE DRAWINGS

The accompanying drawings, which are incorporated in and constitute a part of this specification, illustrate embodiments and together with the description, serve to explain the principles of the methods and systems.

DETAILED DESCRIPTION

Before the present methods and systems are disclosed and described, it is to be understood that the methods and systems are not limited to specific methods, specific components, or to particular implementations. It is also to be understood that the terminology used herein is for the purpose of describing particular embodiments only and is not intended to be limiting.

As used in the specification and the appended claims, the singular forms "a," "an," and "the" include plural referents unless the context clearly dictates otherwise. Ranges may be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

"Optional" or "optionally" means that the subsequently described event or circumstance may or may not occur, and that the description includes instances where said event or circumstance occurs and instances where it does not.

Throughout the description and claims of this specification, the word "comprise" and variations of the word, such as "comprising" and "comprises," means "including but not limited to," and is not intended to exclude, for example, other components, integers or steps. "Exemplary" means "an example of" and is not intended to convey an indication of a preferred or ideal embodiment. "Such as" is not used in a restrictive sense, but for explanatory purposes.

Disclosed are components that can be used to perform the disclosed methods and systems. These and other components are disclosed herein, and it is understood that when combinations, subsets, interactions, groups, etc. of these components are disclosed that while specific reference of each various individual and collective combinations and permutation of these may not be explicitly disclosed, each is specifically contemplated and described herein, for all methods and systems. This applies to all aspects of this application including, but not limited to, steps in disclosed methods. Thus, if there are a variety of additional steps that can be performed it is understood that each of these additional steps can be performed with any specific embodiment or combination of embodiments of the disclosed methods.

The present methods and systems may be understood more readily by reference to the following detailed description of preferred embodiments and the examples included therein and to the Figures and their previous and following description.

Figure 1:
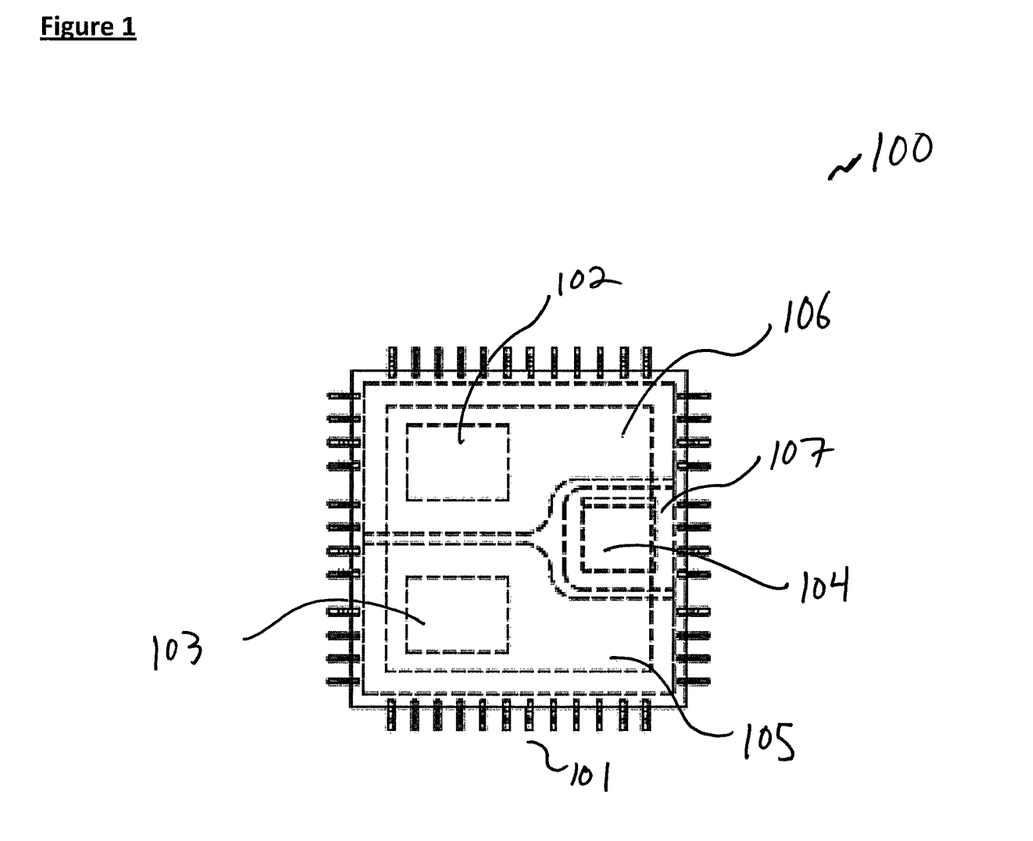
FIG. 1 is a split pad quad flat packaging (QFP) according to an aspect of the present disclosure.

Certain attempts have been made to achieve electrical isolation of the die within the electronic packaging. One such configuration is disclosed in FIG. 1. According to this aspect of the present disclosure, the single exposed copper pad of a quad flat packaging (QFP) 100 is split into three separate pads, 105-107. Each of the respective pads may be coupled to a respective individual die, 102-104, which are in turn coupled to external leads 101. The aspect of FIG. 1 was an attempt to modify the existing designs of exposed copper QFPs to achieve electrical isolation of the die, but it did not achieve the desired thermal conduction or full power dissipation of the packaging as do certain aspects of the present disclosure.

Figure 2:
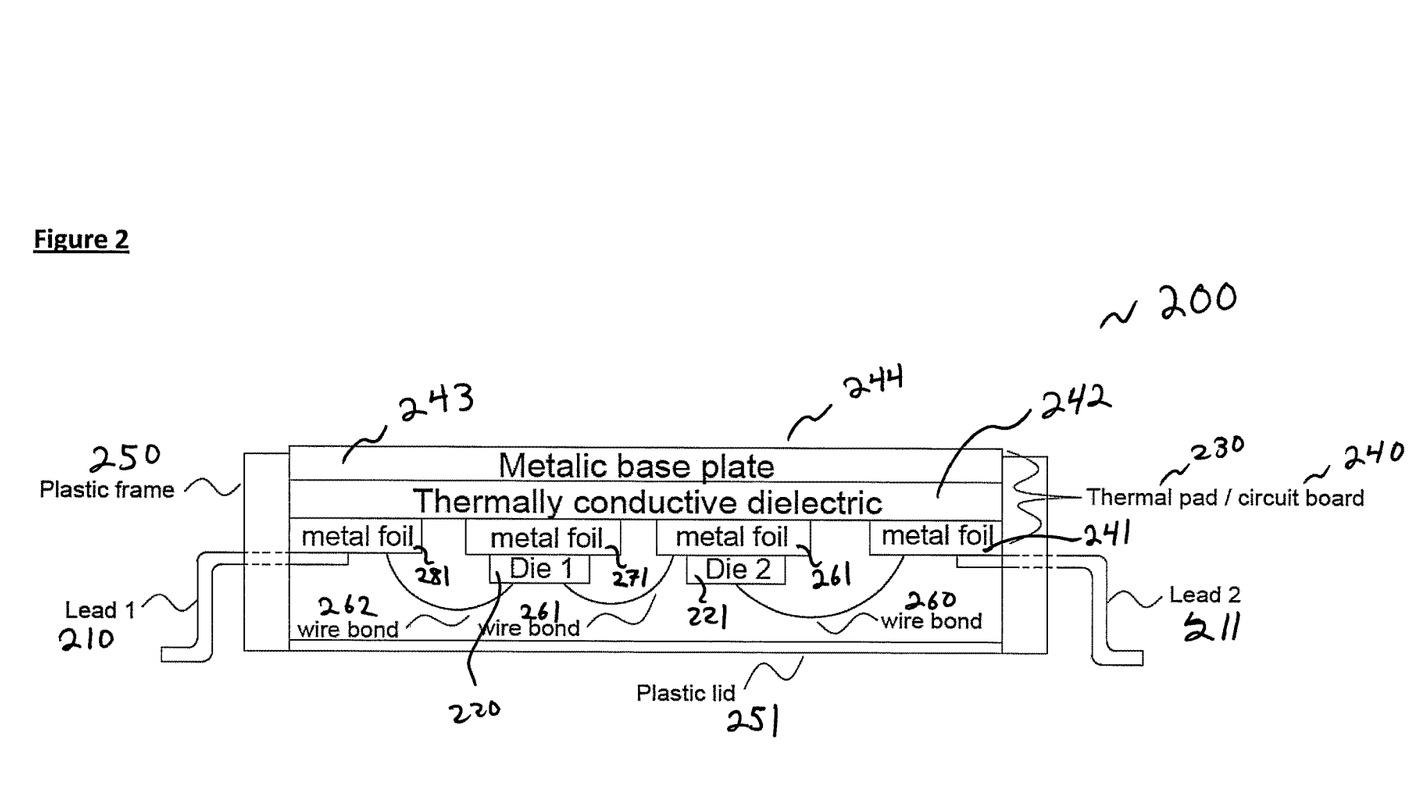
FIG. 2 is a profile view of an aspect according to the present disclosure.

Referring now to an aspect of the disclosure according to FIG. 2, an apparatus 200 comprises a circuit board 240. According to this aspect, circuit board 240 may be any type of circuit board, such as, for example, a printed circuit board (PCB), multi-level PCB, flexible or rigid PC, printed wiring board (PWB), or an IMS or insulated metal substrate circuit board, made of any combination of conductive and non-conductive materials, such as FR-4, polyimide, HTC dielectric, aluminum, or copper.

Also according to this aspect, circuit board 240 further comprises a metallic base plate 243, a thermally conductive dielectric 242, and a plurality of metallic pads 241, 261, 271, 281. According to this aspect, the metallic base plate 243 can comprise a layer including any type of conductive material. For example, a 1-2 mm thick layer of copper, aluminum, or other metal. The metallic base plate may be configured to be electrically isolated from the plurality of metallic pads. Also according to this aspect, the thermally conductive dielectric 242 can comprise a layer including any type of non-conductive or electrically insulating material. While described as a dielectric material, the thermally conductive layer can also comprise an insulated metal substrate.

Referring again to an aspect of the disclosure according to FIG. 2, circuit board 240 may further comprise a plurality of die 220-221, where each of the die 220-221 may be coupled to a respective one of the plurality of metallic pads 241, 261, 271, 281 that may, for example, each comprise metallic foil. The metallic foil may be made of, for example, copper, plated copper, gold, gold plated, and any other suitable electrically conductive material. According to this aspect, based on each of the die 220-221 being coupled to a respective one of the plurality of metallic foil pads 241, 261, 271, 281, the first die 220 is configured to exhibit a first bottom-side electrical potential and the second die 221 is configured to exhibit a second bottom-side electrical potential. For example, the first bottom-side electrical potential and the second bottom-side electrical potential according to this aspect may be different so that the die may operate, for example, at different power voltage levels or ground reference levels, or they can be the same. In other aspects, the bottom-side electrical potentials of the die may all three be different, all three the same, two the same and one different, and of any value, including zero potential.

Apparatus 200 may be further configured to conduct heat away from the die 220-221.

According to this aspect, the heat from the die 220-221 can be conducted via, for example, at least the metallic base plate 243, the thermally conductive dielectric 242, and the plurality of metallic pads 241, 261, 271, 281. For example, heat resulting from power dissipation or otherwise from the die 220-221 may be conducted from the die 220-221 to the metallic pads 241, 261, 271, 281, through the thermally conductive dielectric 242, through the metallic base plate 243, and away from the apparatus 200 via an external heat tab 244 that may be either part of or separate from the metallic base plate 243 and which can be coupled to a heat sink (not shown).

According to another aspect of the present disclosure, apparatus 200 further comprises a plurality of leads 210-211 that may be configured to be coupled to a second apparatus, such as a separate PCB or other electronics and to at least one of the die 220 or 221. The leads 210-211 may be electrically coupled to one or more of the die 220 or 221 via, for example, configuring the leads 210-211 to be coupled to one or more of the metallic foil pads 241, 261, 271, 281 which, in turn, are respectively coupled to one or more of the die 220 or 221 via one or more wire bonds 260-262. According to the aspect of FIG. 1, lead 210 may be coupled to metallic pad 281 which may be coupled to die 220 via wire bond 262. According to this same aspect, lead 211 may be coupled to metallic pad 241 which may be coupled to die 221 via wire bond 260. The leads may, for example, be coupled to the metallic pad 241 which may be coupled to die 221 via conductive material such as solder, sintered silver paste or silver fill conductive epoxy. According to this aspect, leads 210-211 may be further configured to be physically coupled to or pass through a non-conductive housing 250 that is configured to at least partially enclose the circuit board 240. The housing material may be, for example, plastic, ceramic, metal and so forth. For example, non-conductive housing 250 may comprise plastic or other insulating or non-conductive material configured to enclose the sides of the circuit board 240 while leaving metallic base plate 243 exposed and may further comprise a plastic lid 251 that may enclose the bottom portion of the apparatus. Or the plastic housing may be, for example, filled with non-conductive encapsulated material.

The plurality of metallic pads 241, 261, 271, 281 may further comprise electrically isolated pairs or sets of metallic pads. In one aspect, a first metallic pad 271 and a second metallic pad 261 are electrically isolated from each other, as well as a third pad 281 and a fourth pad 241 that are also electrically isolated from each other. According to this aspect, the first die 220 may be configured to be coupled to the first pad 271, to the second pad 261, and to the third pad 281, and the second die 221 may be configured to be coupled to the second pad 261 and to a fourth pad 241. For example, the die 220-221 may be configured to be coupled to the metallic pads via one or more wire bonds 260-262, for example, as disclosed above and herein, or via conductive die attach material such as solder, sintered silver paste or silver filled epoxy.

According to yet another aspect, each of the plurality of metallic pads 241, 261, 271, 281 of apparatus 240 may be configured to be coupled to at least one of the plurality of leads 210-211, and each of the plurality of metallic pads 241, 261, 271, 281 may be coupled to the thermally conductive dielectric 242, while the thermally conductive dielectric 242 may be coupled to the metallic base plate 244. According to another aspect, apparatus 240 may further comprise a heat sink (not shown) coupled to the die 220-221, where the apparatus 240 is further configured to conduct heat away from the die 220-221 to the heat sink. While apparatus 200 is described with reference to two die 220 and 221 for ease of explanation, a person skilled in the art would appreciate that apparatus 200 can comprise any number of die.

Figure 3:
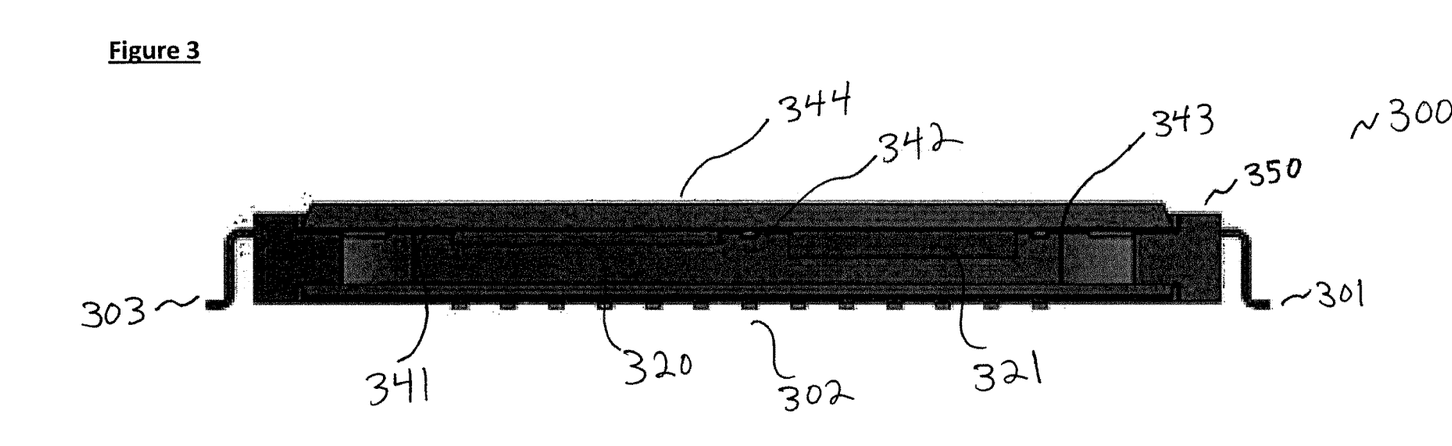
FIG. 3 is a cross-sectional view of an aspect according to the present disclosure.
Figure 4:
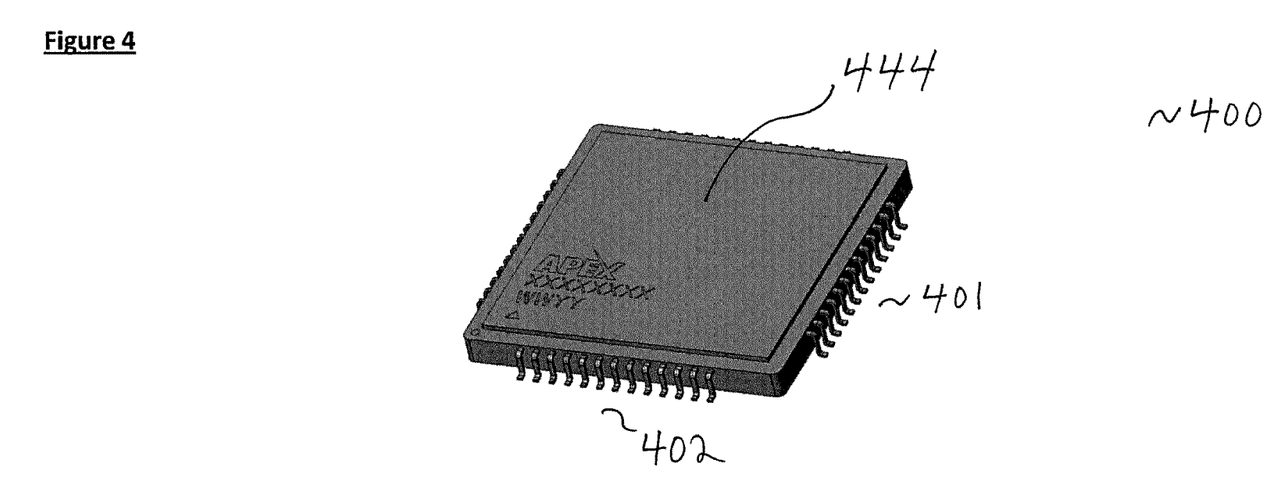
FIG. 4 is an isometric view of an aspect according to the present disclosure.

FIG. 3 and FIG. 4 disclose various vantage points of a configuration of non-conductive housing 250, 350, 450 and leads 210-211, 301-303, 401-402 according to aspects according to FIG. 2. For example, metallic base plate 344, 444 may be located at the top of the apparatus 200, 300, 400 and may serve a heat sink, an external heat tab, or thermal pad 230 for the apparatus that may be connected to a heat sink. The heat sink can be external to the apparatus 200, 300, 400. Die 320-321, pads 341-343, and leads 301-303 may then be configured or connected according to the aspect of FIG. 2, or otherwise. In the aspect according to FIG. 4 and FIG. 5, non-conductive housing may enclose the entirety of the circuit board except for metallic base plate 344, 444, including the sides and bottom of the apparatus, wherein the bottom of the apparatus may include a plastic lid such as plastic lid 251 or non-conductive epoxy or plastic encapsulate according to the aspect of FIG. 2.

Figure 5:
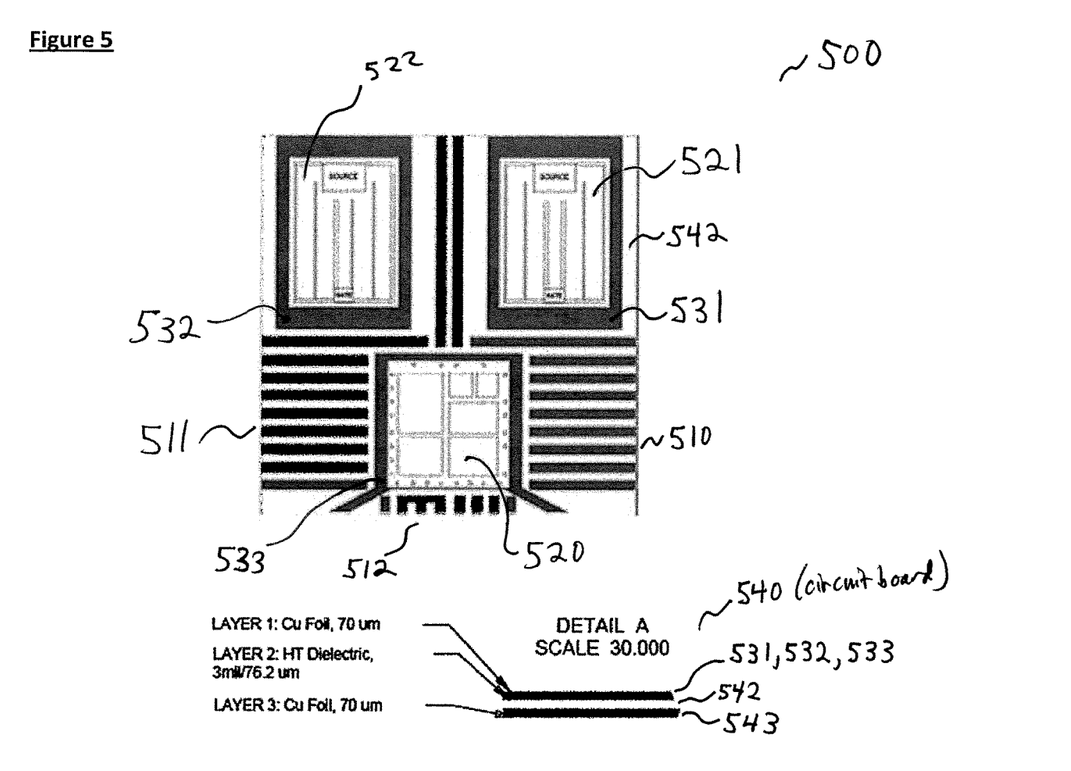
FIG. 5 is a top view of an aspect according to the present disclosure.
Figure 6:
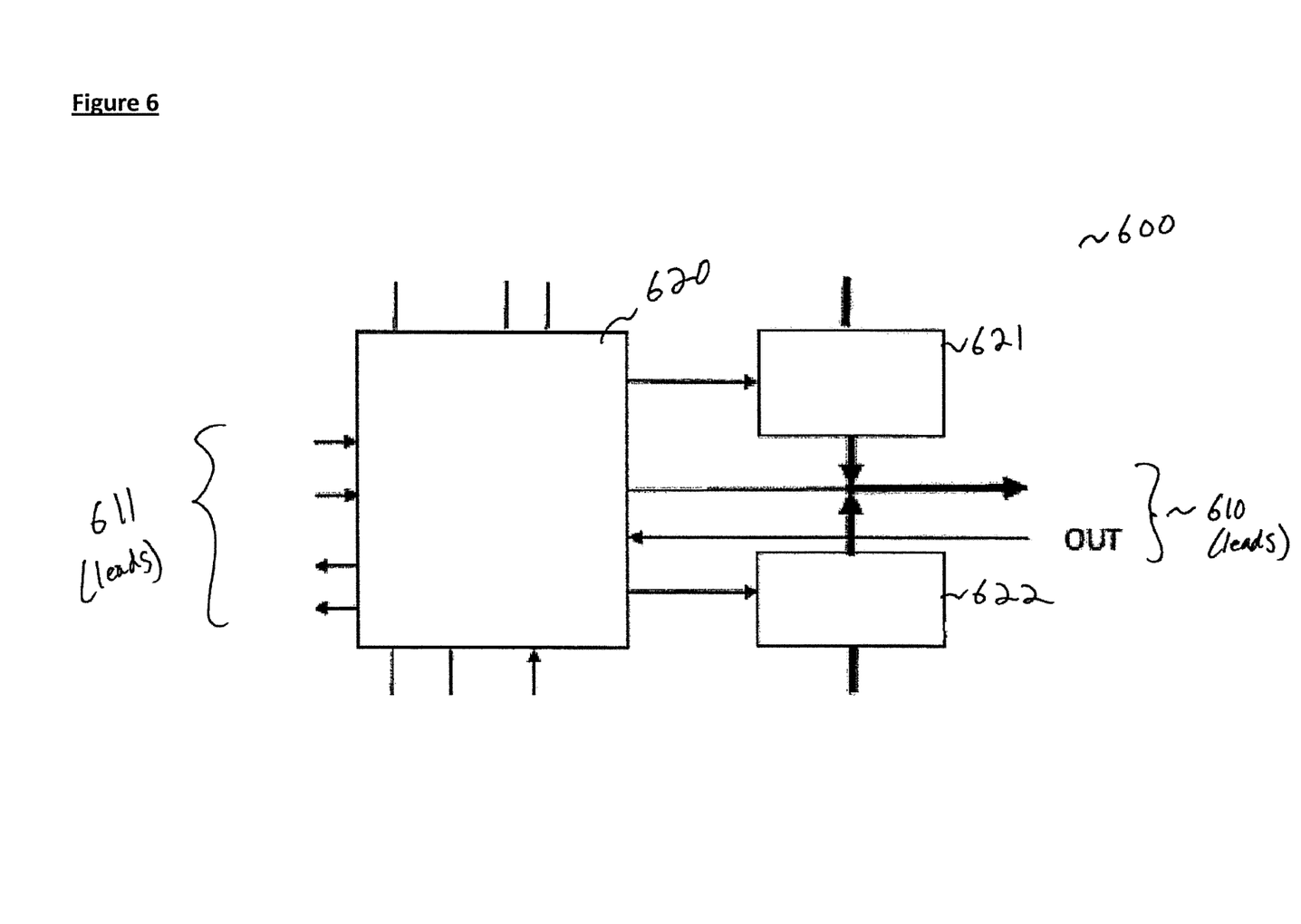
FIG. 6 is an exemplary die configuration of an aspect according to the present disclosure.

Referring now to FIG. 5, and FIG. 6, the die 520-522, 620-622 of apparatus 500 and 600 may further comprise a third die 522, 622 where the third die 522, 622 is configured to exhibit a third bottom-side electrical potential. The third bottom-side electrical potential may be the same or different from either or both of the first or second bottom-side electrical potentials of the other two dies 520-521, 620-621. According to this aspect, the first die 520, 620 comprises an integrated circuit, the second die 521, 621 comprises an NMOS transistor circuit, and the third die 522, 622 comprises a PMOS transistor circuit. In this configuration, second and third die 521-522, 621-622 may serve as driver circuits for the respective positive and negative output signals of first die 520, 620. An IC die may drive 2 to 4 NMOS, or 2 to 2 NMOS and 1 to 2 PMOS transistors in a half bridge or full H bridge switching amplifier configuration. Any combination of IC die and discrete semiconductor components may be used including analog ICs, digital ICs, mixed signal ICs, or a combination of the three.

FIG. 5 shows an aspect of the present disclosure according to FIG. 2 in an exemplary embodiment from a bottom-up vantage point having at least three die 520-522 coupled to a circuit board 540. The circuit board 540, as shown in Detail A of FIG. 5, may comprise three layers such as a metallic baseplate 543, dielectric layer 542 and metallic foil pads 531-533, wherein the die 520-522 may be coupled to a respective one of the metallic foil pads 531-533. According to this aspect, apparatus 500 comprises at least three die 520-522 that may be respectively coupled to metallic foil pads 531-533, each of which may be electrically isolated from each other such that the three die 520-522 may comprise different or the same bottom-side potentials. Alternatively, two die may have the same bottom-side potentials while the third die has a different bottom-side potential.

Apparatus 500 may be further configured to conduct heat away from the plurality of die 520-522. According to this aspect, heat from die 520-522 can be conducted via, for example, at least the metallic base plate 543, the thermally conductive dielectric 542, and the plurality of metallic pads 531-533. For example, heat resulting from power dissipation or otherwise from die 520-522 may be conducted from the die to the metallic pads 531-533, through the thermally conductive dielectric 542, through the metallic base plate 543, and away from the apparatus 500 via an external heat tab that may be coupled to a heat sink (not shown). Apparatus 500 may further comprise a plurality of leads 510-512 that may be configured to be coupled to a second apparatus, such as a separate PCB or other electronics and to at least one of the die 520-522.

Referring now to FIG. 6, in alternative aspects, a first die 620 may be configured or manufactured to be a custom integrated circuit (IC) or programmable logic device. For example, the first die 620 can be a microprocessor, microcontroller, FPGA, DSP, power amplifier, operational amplifier, pulse-width modulator (PWM), voltage reference, transistors (e.g., NMOS, PMOS, bipolar junction, MOSFET), analog, digital, mixed signal or any other type of IC. According to one aspect, a second die 621 may comprise an NMOS transistor circuit, and a third die 622 may comprise a PMOS transistor circuit. Alternatively, the second die 621 or the third die 622 may be switched such that second die 621 comprises a PMOS transistor circuit and third die 622 comprises an NMOS transistor circuit. The second and third die 621-622 may comprise any type of transistor or related circuit, such as a metal-oxide field effect transistor, bipolar junction transistor, diodes, or any other type of semiconductor device. According to the aspect of FIG. 6, the NMOS die 621 may be coupled to an output of the first die 620 via an NMOS transistor source voltage or current of the die 621, while the PMOS die 622 may be coupled to an output of the first die 620 via a PMOS drain voltage or current of the die 622. According to this aspect, the second and third die 621-622 may be configured as an output stage voltage or current amplifier circuit for the output of the first die 620. Further, the apparatus 600 can include leads 610-611 which can be coupled to one or more additional components (e.g., ICs, transistors, resistor, or any electrical component), apparatus, or any electrical device. For example, the apparatus 600 can be electrically coupled to the one or more additional components, the apparatus or the electrical device.

In other aspects, apparatus 600 may further comprise additional die that may include one or more additional custom ICs, transistors, or other types of semiconductor devices that are respectively coupled to additional metallic pads that are electrically isolated from each other and configured to conduct heat away from each of the respective die via the thermally conductive dielectric and the metallic base plate away from the apparatus.

Figure 7:
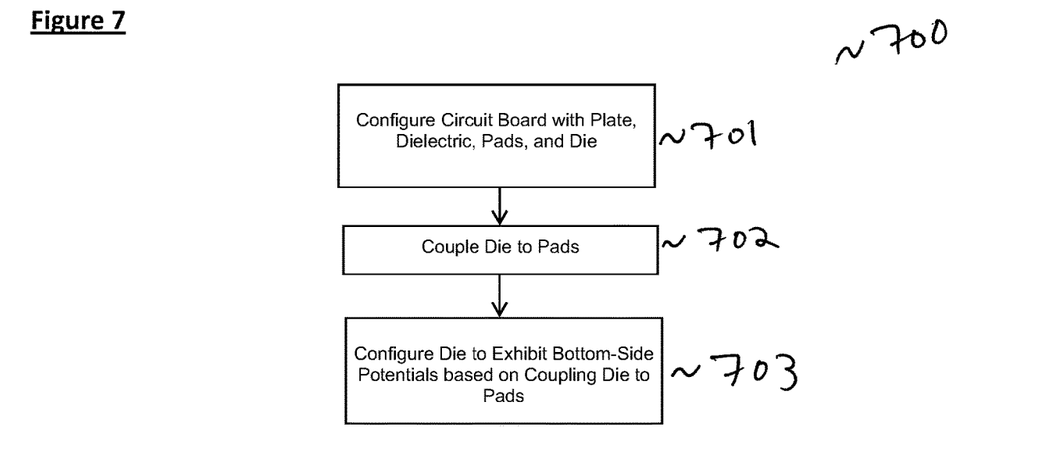
FIG. 7 is a flowchart of an aspect of a method according to the present disclosure.

Referring now to an aspect according to FIG. 7, a method may comprise a step 701 for configuring a circuit board to include a metallic base plate, a thermally conductive dielectric, a plurality of metallic pads, and a plurality of die. For example, step 701 can include manufacturing, producing, or using an insulated metal substrate (IMS) circuit board that includes a metallic base plate, thermally conductive dielectric, and plurality of metallic pads manufactured to be integrated within the IMS circuit board as different layers.

The method 700 may further comprise step 702 for coupling each of the plurality of die to a respective one of the plurality of metallic pads, wherein the plurality of die comprises a first die and a second die. For example, step 702 can include soldering or otherwise electrically coupling the first and second die to the metallic pads of the IMS board. According to other aspects, method 700 may include a step for configuring the plurality of metallic pads to include four pads, each of which is electrically isolated from each other by, for example, being separated by a dielectric material that can be part of the thermally conductive dielectric layer of an IMS board, or a ceramic substrate. According to this aspect, the method may include configuring the first die to be coupled to the first pad, to the second pad, and to the third pad all via wire bonding or other electrical coupling, and then the second die can be coupled to the second pad and to the fourth pad also via wire bonding or other electrical coupling. The pads may then be coupled to at least one of the circuit board's leads through welding them or soldering them together or otherwise electrically connecting them.

Method 700 may further include a step 703 for configuring the first die to exhibit a first bottom-side electrical potential and configuring the second die to exhibit a second bottom-side electrical potential based on coupling each of the plurality of die to a respective one of the plurality of metallic foil pads. The metallic pad coupled to the first die may be coupled to a first lead that is coupled to a first external source for generating the first bottom-side electrical potential, and the metallic pad coupled to the second die may be coupled to a second lead that is coupled to a second external source for generating the second bottom-side electrical potential. According to one aspect, the first bottom-side electrical potential of the first die and the second bottom-side electrical potential of the second die may have different values. The circuit board can conduct heat away from the plurality of die. For example, heat dissipates away from the first die and the second die via the metallic base plate, the thermally conductive dielectric, and the plurality of metallic pads. According to this aspect, for example, layers of the circuit board may be structured or arranged such that power dissipated from the first and second die may be thermally conducted from the die to the metallic pads, through the thermally conductive dielectric and then out of the circuit board through the metallic base plate and into an external heat sink.

According to other aspects, method 700 may further comprise a step for configuring the leads to be coupled to a second apparatus and to at least one of the die by soldering or otherwise electrically coupling them. The method may also include a step for configuring a non-conductive housing, such as plastic, to at least partially enclose the circuit board. The method may further comprise a step for configuring the metallic base plate to be electrically isolated from the plurality of metallic pads, such as by including the dielectric material between them, and for making each of the metallic pads out of foil or other conducting material.

According to yet another aspect of the present disclosure, method 700 may further include a step for configuring a heat sink to be coupled to the die and further configuring the circuit board to conduct heat away from the die to the heat sink. For example, according to one aspect the heat sink can be a device or substance for absorbing excessive or unwanted heat from the die that may be fan-cooled, liquid cooled, cold plate, Peltier cooling device or thermal heat pipes and may be made out of aluminum, copper, or other thermally conductive materials. According to another aspect, method 700 may further include a step for configuring a third die to exhibit a third bottom-side electrical potential that may be different or the same as the first and second die's bottom-side potential. According to this aspect, the first die may be a custom IC or other semiconductor or electronic circuit that is soldered or otherwise electrically coupled to the pads. Also according to this aspect, the second die may be a an NMOS transistor or any other type of transistor or electronic circuit, and the third die may be a PMOS transistor or any other type of transistor or electronic circuit.

While the methods and systems have been described in connection with preferred embodiments and specific examples, it is not intended that the scope be limited to the particular embodiments set forth, as the embodiments herein are intended in all respects to be illustrative rather than restrictive.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that an order be inferred, in any respect. This holds for any possible non-express basis for interpretation, including: matters of logic with respect to arrangement of steps or operational flow; plain meaning derived from grammatical organization or punctuation; the number or type of embodiments described in the specification.

It will be apparent to those skilled in the art that various modifications and variations can be made without departing from the scope or spirit. Other embodiments will be apparent to those skilled in the art from consideration of the specification and practice disclosed herein. It is intended that the specification and examples be considered as exemplary only, with a true scope and spirit being indicated by the following claims.

What is claimed is:

1. An apparatus, comprising:
   a circuit board comprising a metallic base plate, a thermally conductive dielectric, and a plurality of metallic pads;
   at least three die, wherein each die of the at least three die are coupled to a respective metallic pad the plurality of metallic pads;
   wherein, based on each of the at least three die being coupled to a respective metallic pad of the plurality of metallic pads, a first die of the at least three die is configured to exhibit a first bottom-side electrical potential, a second die of the at least three die is configured to exhibit a second bottom-side electrical potential, and a third die of the at least three die is configured to exhibit a third bottom-side electrical potential, wherein the first bottom-side electrical potential, the second bottom-side electrical potential, and the third bottom-side electrical potential are each electrically isolated from each other, wherein the second die serves as a driver circuit for positive output signals of the first die and the third die serves as a driver circuit for negative output signals of the first die; and wherein the apparatus is configured to conduct heat away from the at least three die via the thermally conductive dielectric.

2. The apparatus of claim 1, wherein the apparatus further comprises:

a plurality of leads configured to be coupled to a second apparatus and to a die of the at least three die, and a non-conductive housing configured to at least partially enclose the circuit board.

3. The apparatus of claim 1, wherein each of the plurality of metallic pads comprises a metallic foil.

4. The apparatus of claim 1, wherein the circuit board comprises an insulated metal substrate board.

5. The apparatus of claim 1, wherein the plurality of metallic pads comprises a first metallic pad and a second metallic pad that are electrically isolated from each other.

6. The apparatus of claim 5, wherein the plurality of metallic pads further comprises a third metallic pad and a fourth metallic pad, wherein the first metallic pad, the second metallic pad, the third metallic pad, and the fourth metallic pad are each respectively isolated from each other, and wherein the first die is configured to be coupled to the first metallic pad, to the second metallic pad, and to the third metallic pad, and the second die is configured to be coupled to the second metallic pad and to the fourth metallic pad.

7. The apparatus of claim 2, wherein each of the plurality of metallic pads is configured to be coupled to at least one of the plurality of leads.

8. The apparatus of claim 1, wherein each of the plurality of metallic pads is coupled to the thermally conductive dielectric, and wherein the thermally conductive dielectric is coupled to the metallic base plate.

9. The apparatus of claim 1, further comprising a heat sink coupled to the at least three die, wherein the apparatus is further configured to conduct heat away from the plurality of die to the heat sink.

10. The apparatus of claim 1, wherein the first die comprises an integrated circuit, wherein the second die comprises an NMOS transistor circuit, and wherein the third die comprises a PMOS transistor circuit.

11. A method, comprising:

configuring a circuit board to comprise a metallic base plate, a thermally conductive dielectric, a plurality of metallic pads, and at least three die;

coupling each die of the at least three die to a respective metallic pad of the plurality of metallic pads; and configuring, based on coupling each of the at least three to a respective metallic pad of the plurality of metallic pads, a first die of the at least three die to exhibit a first bottom-side electrical potential, a second die of the at least three die to exhibit a second bottom-side electrical potential, and a third die of the at least three die to exhibit a third bottom-side electrical potential, wherein the first bottom-side electrical potential, the second bottom-side electrical potential, and the third bottom-side electrical potential are each electrically isolated from each other, wherein the second die serves as a driver circuit for positive output signals of the first die and the third die serves as a driver circuit for negative output signals of the first die, wherein the circuit board conducts heat away from the plurality of at least three die via the thermally conductive dielectric.

12. The method of claim 11, wherein the method further comprises:

configuring a plurality of leads to be coupled to a second apparatus and to a die of the at least three die, and configuring a non-conductive housing to at least partially enclose the circuit board.

13. The method of claim 11, wherein each of the plurality of metallic pads comprises a metallic foil.

14. The method of claim 11, wherein the circuit board comprises an insulated metal substrate board.

15. The method of claim 11, wherein the plurality of metallic pads comprises a first metallic pad and a second metallic pad that are electrically isolated from each other.

16. The method of claim 15, wherein the plurality of metallic pads further comprises a third metallic pad and a fourth metallic pad, wherein the first metallic pad, the second metallic pad, the third metallic pad, and the fourth metallic pad are each respectively isolated from each other, and configuring the first die to be coupled to the first metallic pad, to the second metallic pad, and to the third metallic pad, and configuring the second die to be coupled to the second metallic pad and to the fourth metallic pad.

17. The method of claim 12, further configuring at least one of the plurality of metallic pads to be coupled to at least one of the plurality of leads.

18. The method of claim 11, further comprising coupling each metallic pad of the plurality of metallic pads to the thermally conductive dielectric, and coupling the thermally conductive dielectric to the metallic base plate.

19. The method of claim 11, further comprising coupling a heat sink to the at least three die, and configuring the circuit board to conduct heat away from the at least three die to the heat sink.

20. The method of claim 11, wherein the first die comprises an integrated circuit, the second die comprises an NMOS transistor circuit, and the third die comprises a PMOS transistor circuit.

* * * * *